US010164057B1

United States Patent
Jeon et al.

(10) Patent No.: US 10,164,057 B1
(45) Date of Patent: Dec. 25, 2018

(54) VERTICAL TUNNELING FIELD EFFECT TRANSISTOR AND METHOD FOR MANUFACTURING THE SAME

(71) Applicant: Samsung Electronics Co., Ltd., Suwon-si, Gyeonggi-do (KR)

(72) Inventors: Kyung Yub Jeon, Yongin-si (KR); Tae Yong Kwon, Suwon-si (KR); Oh Seong Kwon, Hwaseong-si (KR); Soo Yeon Jeong, Osan-si (KR); Yong Hee Park, Hwaseong-si (KR); Jong Ryeol Yoo, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/878,711

(22) Filed: Jan. 24, 2018

Related U.S. Application Data

(60) Provisional application No. 62/514,105, filed on Jun. 2, 2017.

(51) Int. Cl.
| | |
|---|---|
| *H01L 29/66* | (2006.01) |
| *H01L 29/78* | (2006.01) |
| *H01L 29/10* | (2006.01) |
| *H01L 29/423* | (2006.01) |

(52) U.S. Cl.
CPC .... *H01L 29/66666* (2013.01); *H01L 29/1037* (2013.01); *H01L 29/4238* (2013.01); *H01L 29/66553* (2013.01); *H01L 29/7827* (2013.01)

(58) Field of Classification Search
CPC ............. H01L 29/1037; H01L 29/4238; H01L 29/66553; H01L 29/7827

USPC .................. 257/105, 130, 135; 438/212, 173
See application file for complete search history.

(56) References Cited

U.S. PATENT DOCUMENTS

| | | | |
|---|---|---|---|
| 6,352,909 B1 | 3/2002 | Usenko | |
| 8,492,257 B2 | 7/2013 | Shin | |
| 8,735,970 B2 | 5/2014 | Takaishi | |
| 9,443,982 B1 | 9/2016 | Balakrishnan et al. | |
| 9,525,064 B1 | 12/2016 | Balakrishnan et al. | |
| 9,530,863 B1 | 12/2016 | Zhang et al. | |
| 9,530,866 B1 | 12/2016 | Zhang et al. | |
| 9,536,793 B1 | 1/2017 | Zhang et al. | |

(Continued)

FOREIGN PATENT DOCUMENTS

KP  10-0898582 B1  5/2009

*Primary Examiner* — Tan N Tran
(74) *Attorney, Agent, or Firm* — Harness, Dickey, & Pierce, P.L.C.

(57) ABSTRACT

A vertical tunnel field effect transistor (VTFET) including a fin structure protruding from a substrate including a source/drain region, an epitaxially-grown source/drain structure on the fin structure, a cap including pillar portions, the pillar portions covering side surfaces of the epitaxially-grown source/drain structure and partially covering side surfaces of a top portion of the fin structure, a gate insulator covering remaining portions of the side surfaces of the fin structure under the pillar portions of the cap, a work function metal gate on the gate insulator, and a separation pattern surrounding a bottom portion of a fin structure such that the work function metal gate is vertically between the cap and the separation pattern, the separation pattern electrically isolating the work function metal gate from the source/drain region, and a method of manufacturing the same may be provided.

20 Claims, 26 Drawing Sheets

(56) References Cited

U.S. PATENT DOCUMENTS

| | | |
|---|---|---|
| 9,543,246 B2 | 1/2017 | Takaishi |
| 9,570,356 B1 | 2/2017 | Balakrishnan et al. |
| 2010/0181615 A1 | 7/2010 | Ikebuchi |
| 2012/0104487 A1 | 5/2012 | Ikebuchi et al. |
| 2018/0096994 A1* | 4/2018 | Bi .................. H01L 27/0886 |

* cited by examiner

VERTICAL TUNNELING FIELD EFFECT TRANSISTOR AND METHOD FOR MANUFACTURING THE SAME

CROSS-REFERENCE TO RELATED APPLICATION

This non-provisional application claims priority from (the benefit to) U.S. Provisional Patent Application No. 62/514,105 filed on Jun. 2, 2017 in the U.S. Patent and Trademark Office, and all the benefits accruing therefrom under 35 U.S.C. 119, the contents of which are incorporated herein by reference in its entirety.

BACKGROUND

Some example embodiments of the inventive concepts disclosed herein relate to a field effect transistors and/or methods of manufacturing the same, and more particularly, to vertical tunnel field effect transistors (VTFETs) and/or methods of manufacturing the same.

In related art, a VTFET is manufactured using a so-called "Gate First" process. According to the Gate First process, a gate metal material (e.g., a work function metal gate material) is deposited on a semiconductor substrate, which includes protruding fin structures, carbon based spin-on organic hard mask (C—SOH) is coated on the resultant structure, the C—SOH is partially etched back until an upper portion of the gate metal material is exposed to a certain extent, and then the exposed upper portion of the gate metal material is removed using, for example, an wet stripping process, to form a gate electrode having a desired gate length. The gate electrode (e.g., remaining portion of the work function gate metal material) vertically extends to a certain length and horizontally surrounds a fin structure, which is a protruding portion of the substrate and will function as a channel for the VTFET.

The length of the gate electrode of the VTFET (e.g., a height of the gate metal material remaining on the fin) depends on variations in various processes (e.g., C—SOH coating process, C—SOH etch back process, and/or wet stripping of the gate metal material). Thus, the gate length of the VTFET may vary depending on process variations, and electrical characteristics (e.g., shift in threshold voltage) of the VTFET may be degraded.

Further, in the Gate First process, a drain structure is formed using an epitaxial growth process on the fin structures after forming the gate metal electrode. Because the epitaxial growth process involves a substantially high thermal process, a work function of the gate electrode (e.g., a work function of the work function metal gate material) may be affected, and thus a threshold voltage of the VTFET may be shifted.

SUMMARY

Some example embodiments of the present disclosure provide methods of forming a vertical tunnel field effect transistor (VTFET) and/or VTFETs formed thereby.

According to an example embodiment of the present disclosure, a method of manufacturing a vertical tunnel field effect transistor (VTFET) may include providing a fin structure protruding from a substrate and a first insulation layer such that the fin structure is embedded in the first insulation layer and a top surface of the fin structure is exposed by the first insulation layer, removing the first insulation layer around the fin structure to partially expose side surfaces of the fin structure, providing spacers on the partially exposed side surfaces of the fin structure, epitaxially growing a source/drain structure the fin structure and between the spacers, providing a capping layer to connect the spacers to each other to form an intermediate cap structure having a reverse-U shape, which covers top and side surfaces of the source/drain structure and portions of the side surfaces of the fin structure, removing the first insulation layer, providing a gate insulation layer and a work function metal gate layer along the intermediate cap structure and the fin structure, and partially removing the gate insulation layer and the work function metal gate layer to define a gate insulator and a metal gate under the intermediate cap structure.

According to an example embodiment of the present disclosure, a vertical tunnel field effect transistor (VTFET) may include a fin structure protruding from a substrate, the fin structure acting as a channel of the VTFET, the substrate including a source/drain region, an epitaxially-grown source/drain structure on a surface of the fin structure, a cap including pillar portions, the pillar portions covering side surfaces of the epitaxially-grown source/drain structure and partially covering side surfaces of a top portion of the fin structure, a gate insulator covering a remaining portion of the side surfaces of the fin structure under the pillar portions of the cap, a work function metal gate on the gate insulator, and a separation pattern surrounding a bottom portion of a fin structure such that the work function metal gate is vertically between the cap and the separation pattern, the separation pattern electrically isolating the work function metal gate from the source/drain region.

BRIEF DESCRIPTION OF THE DRAWINGS

The above and other features and advantages of the present invention will become more apparent by describing in detail some example embodiments thereof with reference to the attached drawings in which.

DETAILED DESCRIPTION

Some example embodiments of the present disclosure provide methods of manufacturing vertical tunnel field effect transistors (VTFETs) using a "Gate Last" process and/or VTFETs manufactured thereby.

As described above, a length of the gate electrode of a VTFET manufactured by a "Gate First" process may vary depending on variations in a manufacturing process. Further, in the conventional VTFET manufacturing method using the "Gate First" process, a drain structure is epitaxially grown on a fin structure after forming a gate metal electrode. Thus, electrical characteristics (e.g., shift in threshold voltage) of the VTFET may be degraded.

The present inventive concepts manufacture a VTFET using the "Gate Last" process. According to the Gate Last process, gate lengths of VTFETs is defined with a less variation and a metal gate of the VTFET is formed after epitaxially forming a source/drain region on a fin structure. Thus, variation in the gate length may be reduced or prevented, and/or degradations of electrical characteristics of the VTFET may be mitigated or prevented.

Hereinafter, some example embodiments of the present disclosure will be explained with reference to the accompanying drawings.

Figure 1A:
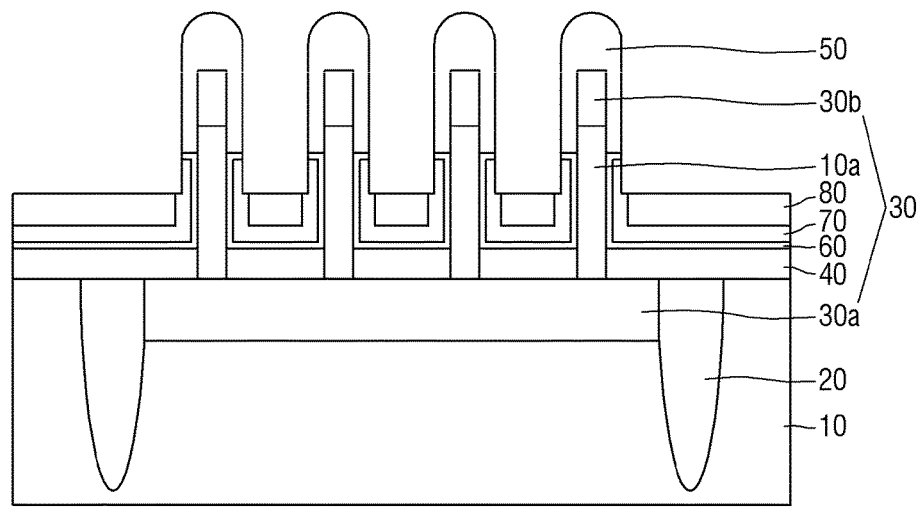
FIG. 1A is a cross-sectional view of an intermediate structure of a vertical tunneling field effect transistor (VTFET), according to an example embodiment of the present disclosure.
Figure 1B:
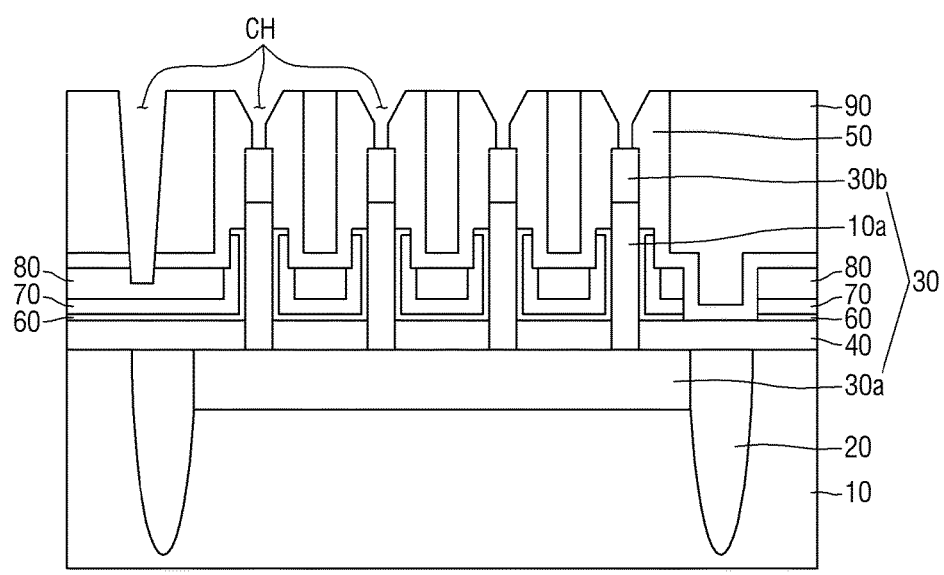
FIG. 1B is a cross-sectional view of the VTFET after defining gate contact holes and source/drain contact holes, according to an example embodiment of the present disclosure.

FIG. 1A is a cross-sectional view of an intermediate structure of a VTFET, according to an example embodiment of the present disclosure, and FIG. 1B is a cross-sectional view of the VTFET after defining gate contact holes and source/drain contact holes, according to an example embodiment of the present disclosure. FIG. 2 is a flow diagram illustrating a method of manufacturing the VTFET of FIGS. 1A and 1B, according to an example embodiment of the present disclosure. FIGS. 3-24 illustrate cross-sectional views at various stages of the method of manufacturing the VTFET of FIG. 2, according to some example embodiment of the present disclosure.

Referring to FIG. 1A, an intermediate VTFET structure 100a may include source/drain regions 30 (e.g., 30a and 30b), a fin structure 10a protruding from a substrate 10 and serving as a channel, a separation pattern 40 surrounding a bottom portion of the fin structure 10a, a cap 50 having a reverse-U shape, a gate insulator 60 covering a portion of the side surface of the fin structure that is exposed by the cap 50, and a work function metal gate 70 on the gate insulating layer and vertically between the cap and the separation pattern 40.

The substrate 10 may be a portion of a bulk silicon wafer. According to some example embodiments, the substrate 10 may be a silicon portion of a Silicon-On-Insulator (SOI) wafer. In some example embodiments, the substrate 10 may include a material other than silicon, including but not limited to Ge, SiGe, SiC, GeP, GeN, InGaAs, GaAs, InSb, InAs, GaSb, and InP. The substrate 10 may refer to a semiconductor layer epitaxially grown on a base substrate.

A plurality of isolation regions 20 may be provided in the substrate 10 to define a plurality of active regions therebetween. In some example embodiments, the isolation region 20 may be formed using a shallow trench isolation (STI) technique.

The source/drain regions 30 may include one region serving as a source region, and the other region serving as a drain region. In FIGS. 1A and 1B, one of the source/drain regions 30 is provided in the substrate 10, and the other one of the source/drain regions 30 is provided on the fin structure 10a. For example, the source/drain region provided in the substrate 10 will be referred to as the source/drain region 30a, and the source/drain region epitaxially-grown the fin structure 10a will be referred to as an epitaxially-grown source/drain structure 30b for convenience of explanation. In some example embodiments, the region 30a may function as a source region, and the region 30b may function as a drain region. However, example embodiments of the present disclosure are not limited thereto. The region 30a may function as a drain region, and the region 30b may function as a source region.

Accordingly, the cap 50 may have a reverse-U shape covering top and side surfaces of the source/drain structure 30b, which is provided on a top surface of the fin structure 10a. Further, the cap 50 may cover side surfaces of an upper portion of the fin structure 10a to a desired distance. The cap 50 may include an insulating material that has an etching selectivity with respect to the work function metal gate.

In some example embodiments, the gate insulator may include a portion between the separation pattern 40 and the horizontal portion of the work function metal gate 70. Further, the work function metal gate 70 may include a vertical portion on the gate insulator 60 and a horizontal portion on the separation pattern 40.

In some example embodiments, a capping metal gate 80 may be provided on the work function metal gate 70. The work function metal gate 70 and the capping metal gate 80 on the work function metal gate 70 may form a metal gate. A work function of the metal gate of the intermediate VTFET structure 100a may be determined based on material characteristics as well as a thickness of the work function metal gate 70.

With respect to the intermediate VTFET structure 100a, one or more inter-layer dielectric layers 90 may be provided, and contact holes CH (e.g., gate contact holes and source/drain contact holes) may be defined through one or more inter-layer dielectric layers 90 to accommodate metal interconnections or contact plugs for electrical connections. Thus, a VTFET 100b may have a final structure as illustrated in FIG. 1B. As illustrated in FIG. 1B, the final structure of the VTFET 100b includes a cap 50 that has a roof portion with an opening and pillar portions extending from both ends of the roof portion. Thus, the cap covers top and side surfaces of the epitaxially-grown source/drain structure 30b, and side surfaces of a top portion of the fin structure 10a to a desired distance. The opening in the roof portion of the cap 50 enables the epitaxially-grown source/drain structure 30b to be electrically connected to a corresponding one of metal interconnections (or contact plugs) to be provided. In some example embodiments, the final structure of the VTFET 100b may have a reverse-U shape covering top and side surfaces of the epitaxially-grown source/drain structure 30b, which is provided on a top surface of the fin structure 10a, and covering side surfaces of a top portion of the fin structure 10a to a desired distance. Further, the cap 50 may have an opening at a roof portion of the reverse-U shape to electrically connect the epitaxially-grown source/drain structure 30b to a corresponding one of metal interconnections (or contact plugs) to be provided.

Figure 2A:
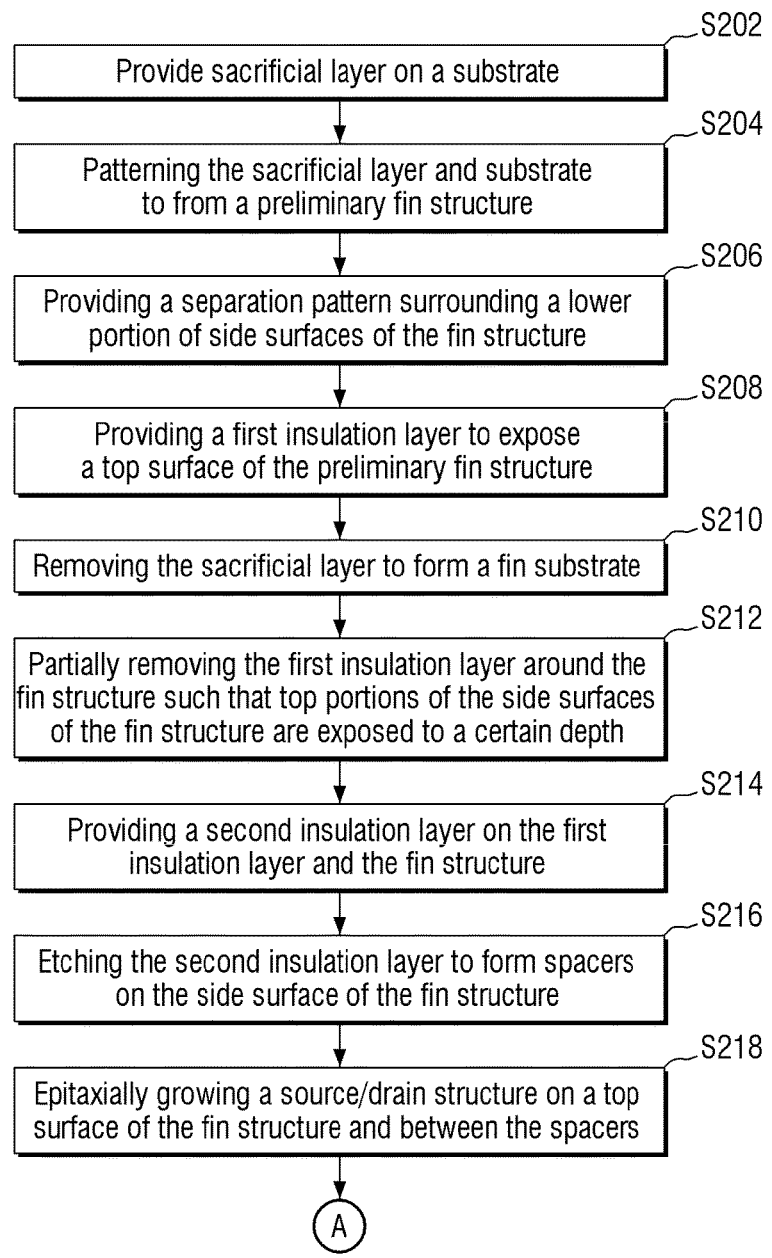
FIGS. 2A and 2B are flow diagrams illustrating a method of manufacturing the VTFET of FIGS. 1A and 1B, according to an example embodiment of the present disclosure.
Figure 2B:
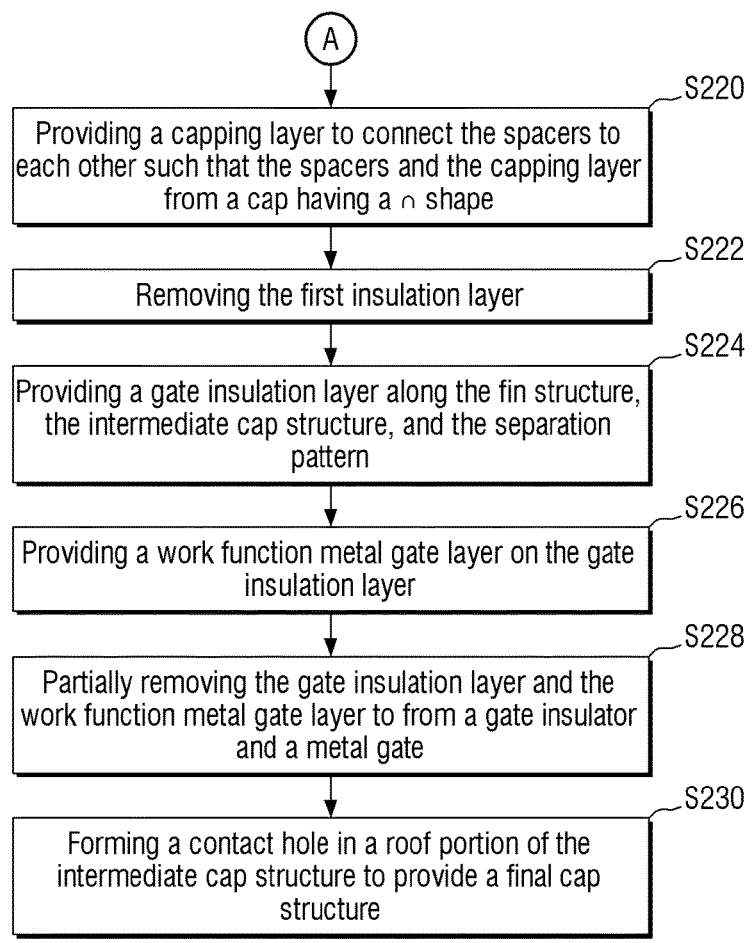

Referring to a flow diagram of FIGS. 2A and 2B, a method of manufacturing the VTFET of FIG. 1 includes operations S202, S204, S206, . . . , and S230. The method begins in operation S202 by providing a sacrificial layer on a substrate. In operation S204, the method patterns the sacrificial layer and the substrate to form a preliminary fin structure. In operation 206, the method provides a separation pattern surrounding a lower portion of side surfaces of the fin structure. The separation pattern provides a physical separation and/or electrical isolation between a gate electrode to be formed and a source/drain region provided in the substrate.

In operation S208, the method provides a first insulation layer to expose a top surface of the preliminary fin structure, which has been defined in operation S204. For example, the first insulation layer may be deposited to cover an entirety of the resultant structure, and then may be etched back to expose the top surface of the preliminary fin structure.

In operation S210, the method removes the sacrificial layer exposed by the first insulation layer to form a fin structure (e.g., a final fin structure).

In operation S212, the method partially removes the first insulation layer around the fin structure such that top portions of side surfaces of the fin structure are exposed to a desired depth when viewed in a vertical cross section. This desired depth may determine a gate length of the VTFET to be formed. In operation S214, the method provides a second insulation layer on the first insulation layer and the fin structure. The second insulation layer may have an etch selectivity with respect to the first insulation layer. In operation S216, the method etches the second insulation layer to form spacers on the side surfaces of the fin structure that have been exposed by partially removing the first insulation layer.

In operation S218, the method epitaxially grows a source/drain structure on a top surface of the fin structure and between the spacers such that a top surface of the source/drain structure is lower than top surfaces of the spacers. In operation S220, the method provides a capping layer to connect the spacers to each other such that the spacers and the capping layer form an intermediate cap structure having a reverse-U shape and covering top and side surfaces of a top portion of the source/drain structure. In operation S222, the method removes the first insulation layer.

In operation S224, the method provides a gate insulation layer along the fin structure, the intermediate cap structure, and the separation pattern. In operation S226, the method provides a work function metal gate layer on the gate insulation layer. In operation S228, the method partially removes the gate insulation layer and the work function metal gate layer such that a gate insulator and a metal gate are formed beneath pillar portions of the intermediate cap structure. In other words, the gate insulator and the metal gate are formed on the side surfaces of the fin structure that are exposed under the intermediate cap structure.

In operation S230, the method forms a contact hole in a roof portion of the intermediate cap structure. Thus, the VTFET formed by the method of FIGS. 2A and 2B includes a final cap structure (e.g., cap) that has a roof portion with an opening and pillar portions extending from both ends of the roof portion.

FIGS. 3-24 illustrate cross-sectional views at various stages or operations of the VTFET manufacturing method diagramed in FIGS. 2A and 2B.

Figure 3:
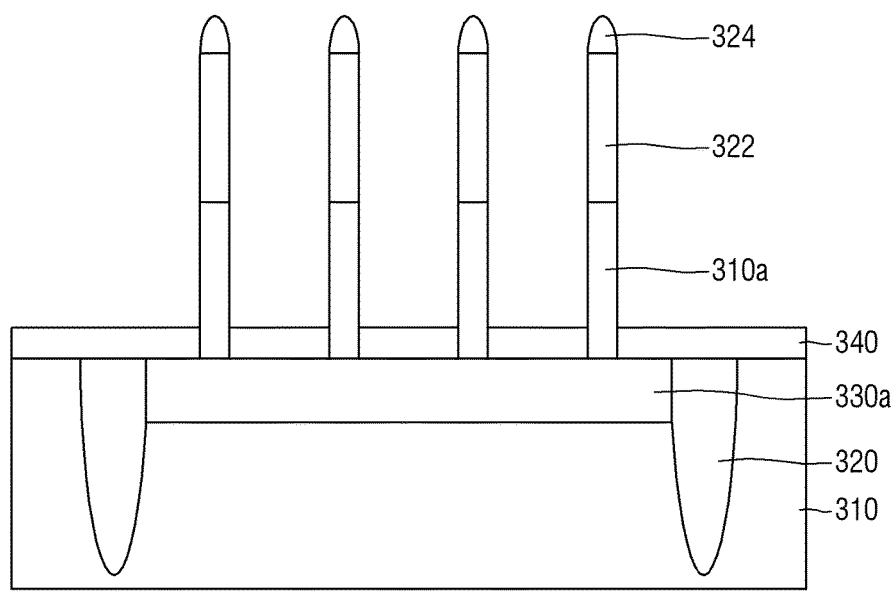
FIGS. 3-24 illustrate cross-sectional views at various stages of methods of manufacturing the VTFET, according to some example embodiments of the present disclosure.

FIG. 3 shows a cross-sectional view after performing operations S202, S204, and S206 of FIG. 2A. Referring to FIG. 3, a sacrificial layer may be provided on a substrate 310. The substrate 310 may be a portion of a bulk silicon wafer, a portion of a SOI wafer, or a semiconductor layer epitaxially grown on a base substrate. The substrate 310 may include a plurality of isolation regions 320, which defines a plurality of active regions therebetween, and a source/drain region 330a. The isolation regions 320 may be formed using, for example, a shallow trench isolation (STI) technique. The source/drain region 330a may be provided in the substrate 310 between the isolation regions 320. For example, the source/drain region 330a may be formed by introducing impurities into the substrate using, for example, an ion implantation technique, and then thermally diffusing the impurities to a desired depth. In some example embodiments, the impurities may be diffused during subsequent processes performed at high temperatures. In such cases, a separate thermal diffusion process for the impurities may not be provided. For example, the sacrificial layer may be a nitride layer. Then, the sacrificial layer and the substrate 310 may be patterned to form a preliminary fin structure, which includes a sacrificial pattern 322 and a fin structure 310a. In some example embodiments, the preliminary fin structure may be about 18 nm wide, and a space between neighboring preliminary fin structure may be about 34 nm.

In some example embodiments, an oxide hard mask layer may be additionally provided on the sacrificial layer, and the oxide hard mask layer may be patterned to form the oxide hard mask pattern 324 when the sacrificial layer and the substrate 310 is patterned. The oxide hard mask pattern 324 may constitute a portion of the preliminary fin structure, and thus facilitate precision patterning of the preliminary fin structure. In some example embodiments, the oxide hard mask pattern 324 may not be provided.

Further, a separation pattern 340 may be provided between the preliminary fin structures. The separation pattern 340 may include a nitride layer. The separation pattern 340 may be provided on the substrate 310 to surround lower portions of side surfaces of the preliminary fin structures. The separation pattern 340 may function as an etch stop layer with respect to an oxide-based insulation layer to be provided thereon when the oxide-based insulation layer is removed using an etch process. Further, the separation pattern 340 may electrically separates a metal gate to be formed from the source/drain region 330a. For example, the separation layer 340 may be provided later after removing the first insulation layer 326 (see FIG. 14).

In some example embodiments, a liner structure (not shown) may be formed on the substrate 310, instead of the separation pattern 340, to surround bottom portions. For example, the liner structure may include a bottom nitride layer and an oxide layer on the bottom nitride layer, and the bottom nitride layer may include (i) a first portion covering a bottom portion of the preliminary fin structure and (ii) a second portion extending from the first portion and horizontally disposed on a portion of the substrate adjoining the preliminary fin. The liner structure may be removed after removing the first insulation layer and before providing the separation pattern.

Figure 4:
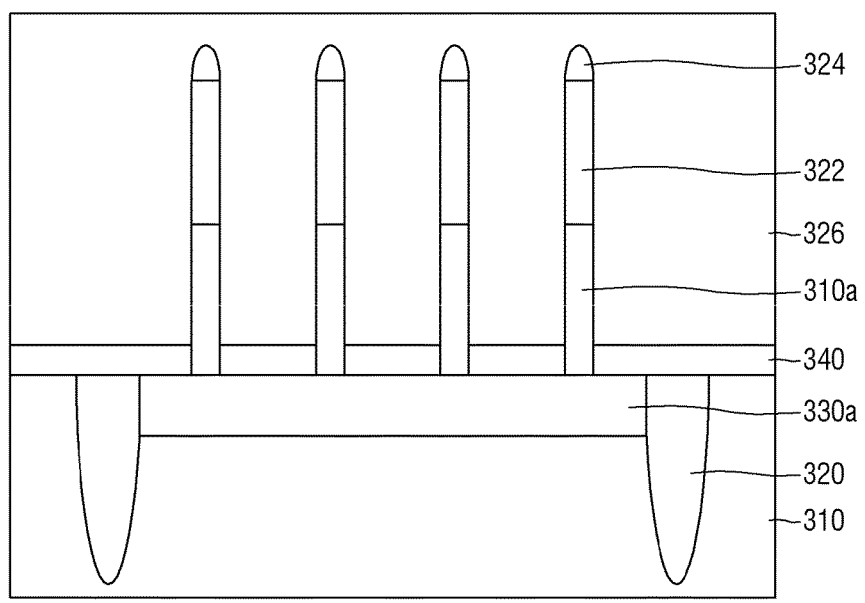

FIG. 4 shows a cross-sectional view after depositing a first insulation layer 326 on the resultant structure of FIG. 3. For example, the first insulation layer 326 may be an oxide layer. The first insulation layer 326 may be planarized using, for example, an etch-back process or a chemical mechanical polishing (CMP) process, to expose a top surface of the preliminary fin structure. In a case where the oxide hard mask pattern 324 is further provided in the preliminary fin structure, the oxide hard mask pattern 324 may be removed while planarizing the first insulation layer 326. Further, the planarizing process may be performed using the sacrificial pattern 322 (e.g., a nitride layer) under the oxide hard mask pattern 324 as an etch stopper.

Figure 5:
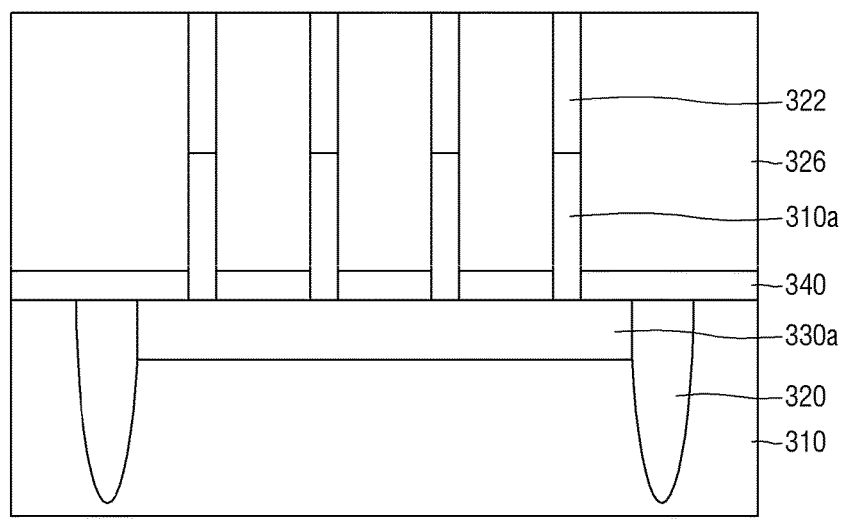

FIG. 5 shows a cross-sectional view of the resultant structure after performing planarization with respect to the first insulation layer 326 (e.g., after performing operation S208 of FIG. 2A). As shown in FIG. 5, the oxide hard mask pattern 324 may be completely removed as a result of the planarization process.

In FIG. 5, the height of a top surface of the first insulation layer 326 after the planarization process is shown to be constant. However, the present inventive concept is not limited thereto. For example, after the planarization process is performed, a step may be formed on the top surface of the first insulation layer 326.

Figure 6:
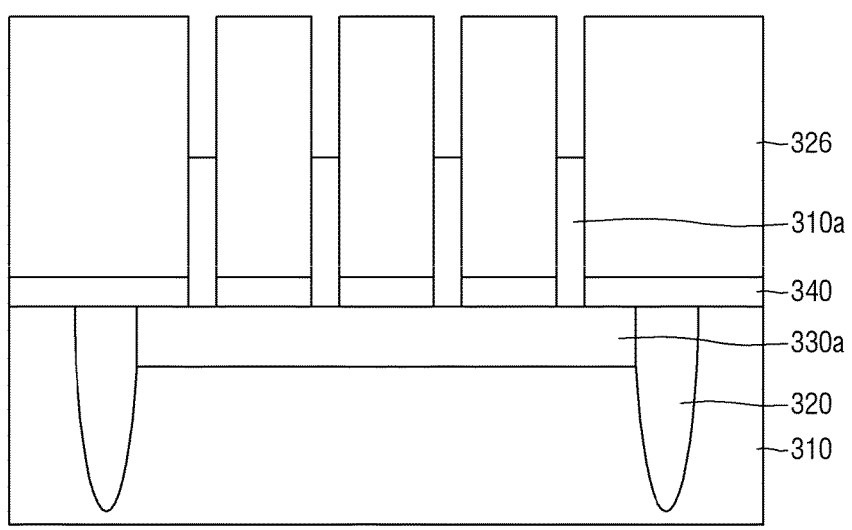

FIG. 6 shows a cross-sectional view after performing operation S210 of FIG. 2A. Referring to FIG. 6, the sacrificial pattern 322 may be selectively removed using, for example, a wet etch process. According to some example embodiments, the sacrificial pattern 322 may include a nitride material and the first insulation layer 326 may include an oxide material. Because a nitride material has an etch selectivity with respect to an oxide material, the sacrificial pattern 322 including a nitride material may be selectively removed by using a wet etch process having an etch selectivity with respect to the nitride material. The removal process of the sacrificial pattern 322 (e.g., nitride pattern) may be referred to a "sacrificial pattern (e.g., nitride pattern) pull back" process.

Figure 7:
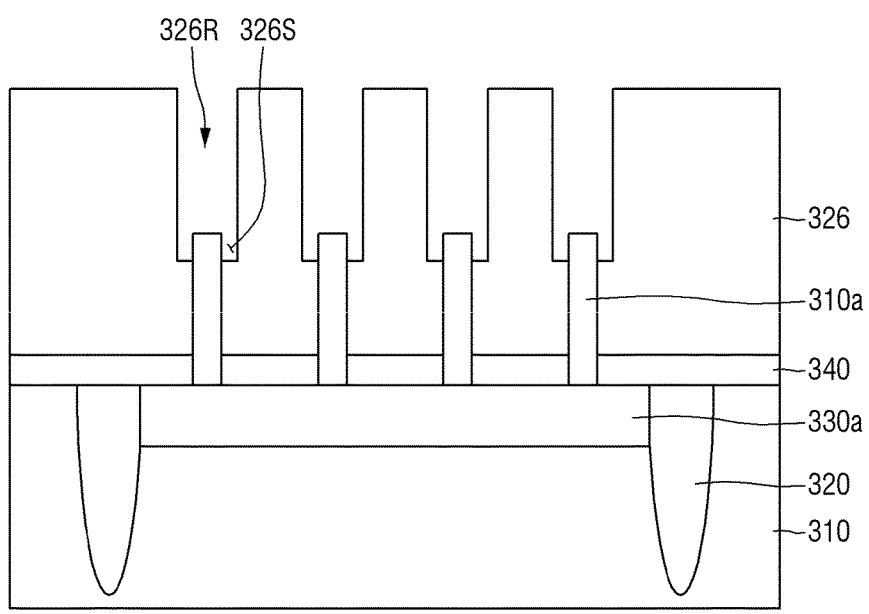

FIG. 7 shows a cross-sectional view after performing operation S212 of FIG. 2A. Referring to FIG. 7, the first insulation layer 326 around the fin structure 310a may be recessed or partially removed such that side surfaces of the fin structure 310a are exposed to a certain depth when viewed in a vertical cross section and a space 326S is provided between the exposed side surfaces of the fin structure 310a and a side surfaces of a first recess 326R defined in the first insulation layer 326. The first insulation layer 326 (e.g., an oxide layer) may be selectively removed with respect to the fin structure 310a (e.g., a silicon layer) by using an etch process having an etch selectivity with regard to the fin structure 310a. In some example embodiments, the etch process may be an isotropic etching process, which etches the first insulation layer 16 in an isotropic manner. In a case that the preliminary fin structure is about 18 nm wide and a space between neighboring preliminary fin structure is about 34 nm, a width of the space 326S may be about 6 nm. This process (e.g., a process of forming a recess or partially removing the first insulation layer 326) may be referred to as an "oxide enlarging" process.

As will be described below, a gate length of a VTFET may depend on a depth of a first recess 326R formed in the first insulation layer 326. Thus, variation in gate lengths of VTFETs may be reduced by mitigation or preventing variation in depths of the recesses 326R formed in the first insulation layer 326. Further, a distance between a top surface of the fin structure 310a and a bottom surface of the first recess 326R of the first insulation layer 326 may provide an electrical isolation between a metal gate electrode to be provided on a side surface of the fin structure 310a and a source/drain structure to be epitaxially grown on the top surface of the fin structure 310a. Considering, for example, ±5% process margin, in a case where the first insulation layer 326 is recessed such that a distance from a top surface of the fin structure 310a and a bottom surface of the first recess 326R of the first insulation layer 326 and/or a width of the space 326S are less than 6 nm, the distance and/or the width can be controlled with a variation less than about 0.6 nm. Thus, variation in gate lengths of VTFETs and related electrical characteristics may be controlled within a range of the process margin.

Figure 8:
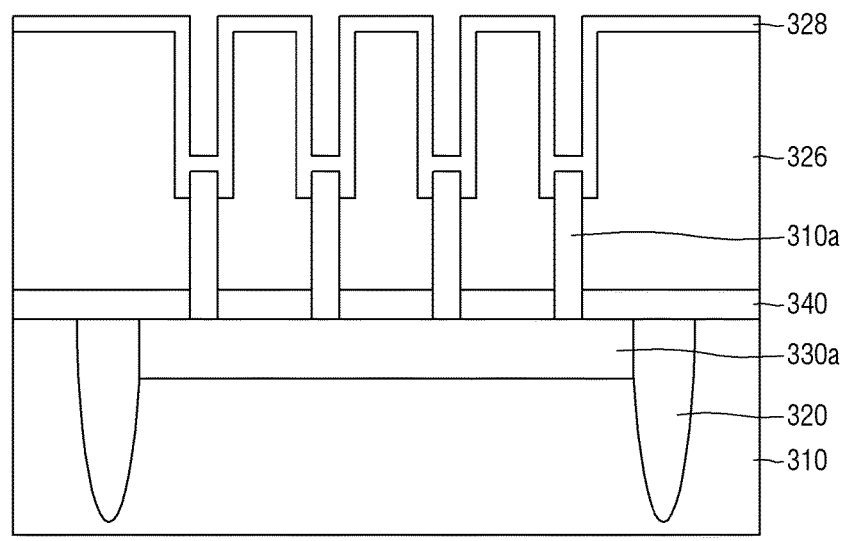

FIG. 8 shows a cross-sectional view after performing operation S214 of FIG. 2A. Referring to FIG. 8, the second insulation layer 328 may be conformally provided on the first insulation layer 326 and the fin structure 310a. For example, the second insulation layer 328 may be formed to completely or partially fill the space 326S. The second insulation layer 328 may include a nitride material. Thus, the second insulation layer 328 may have an etch selectivity with respect to the first insulation layer 326, which includes an oxide material.

Figure 9:
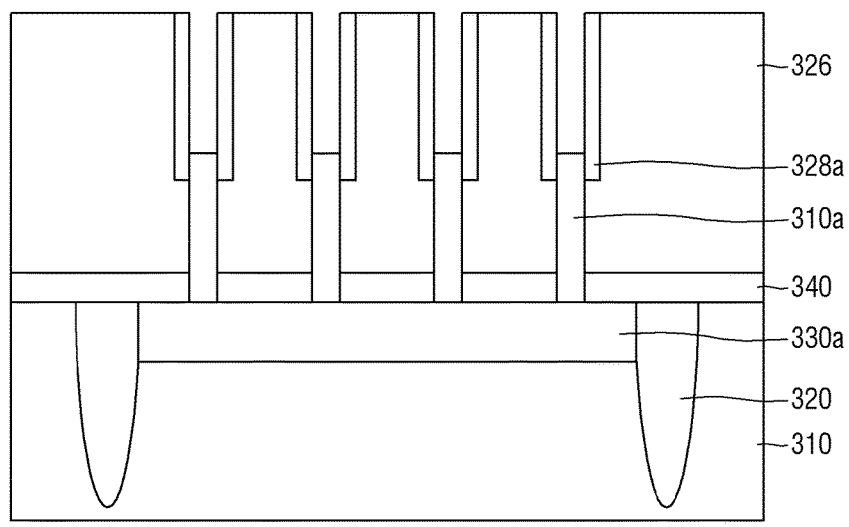

FIG. 9 shows a cross-sectional view after performing operation S216 of FIG. 2A. Referring to FIG. 9, the second insulation layer 328 may be etched to form spacers 328a on the side surfaces of the fin structure 310a that have been exposed by partially removing the first insulation layer 326, as shown in FIG. 7 (e.g., after performing operation S212 of FIG. 2). Subsequent to forming the spacers 328a, a top surface of the fin structure 310a may be cured using, for example, an in-situ post-treatment process.

Figure 10:
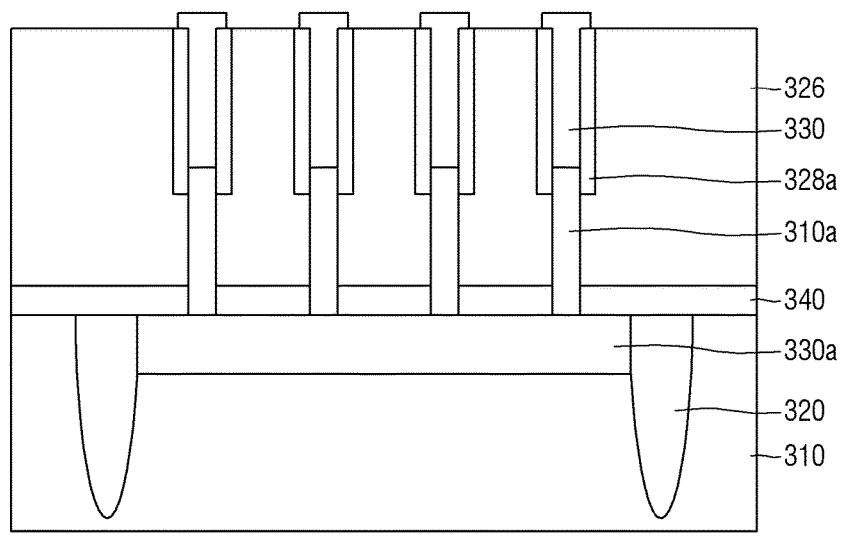
Figure 11:
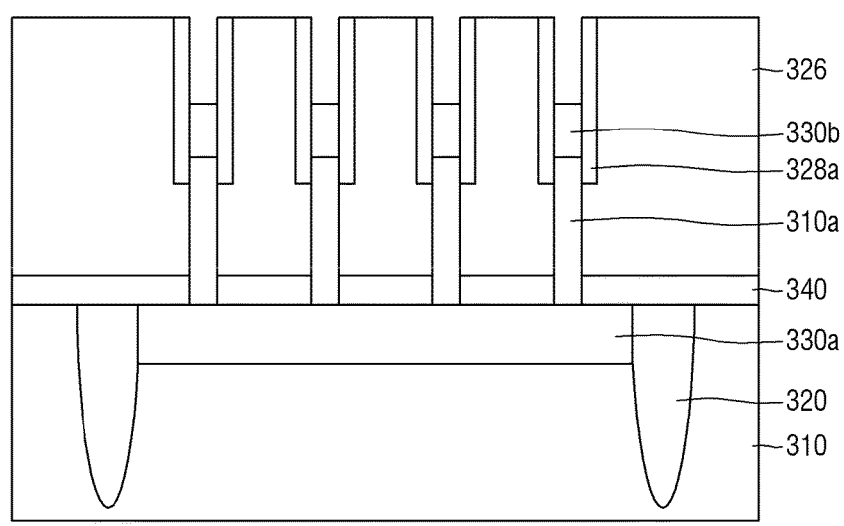

FIGS. 10 and 11 show cross-sectional views relating to operation S218 of FIG. 2A. Referring to FIG. 10, a preliminary source/drain structure 330 may be epitaxially grown from the top surface of the fin structure 310a while being laterally confined within the spacers 328a. The preliminary source/drain structure 330 may be grown beyond a top surface of the first insulation layer 326 as shown in FIG. 10, and be etched back to form a source/drain structure 330b such that a top surface of the source/drain structure 330b is lower than top surfaces of the spacers 328a, as shown in FIG. 11. The source/drain structure 330b may be interchangeably referred to as an epitaxially-grown source/drain structure. In some example embodiments, the source/drain structure 330b may be formed by partially performing an epitaxial growth to a desired thickness, without going through a combination of processes as illustrated in FIGS. 10 and 11.

Figure 12:
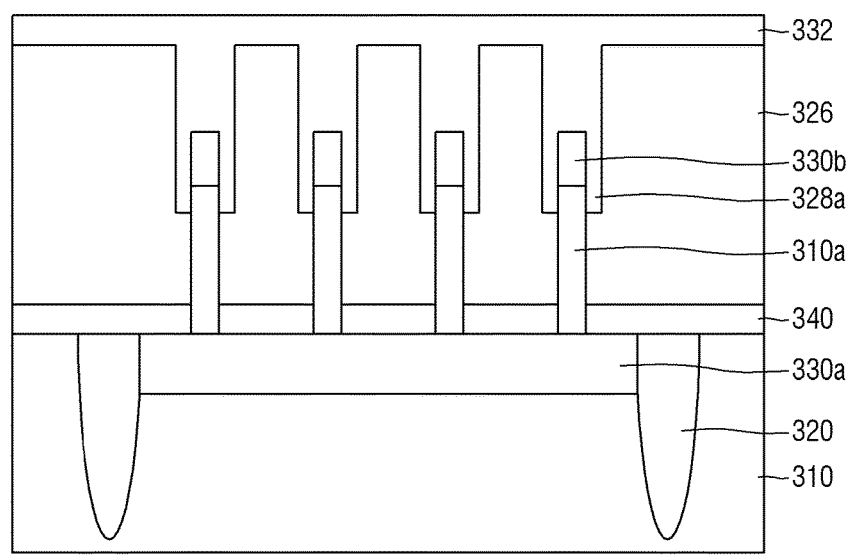
Figure 13:
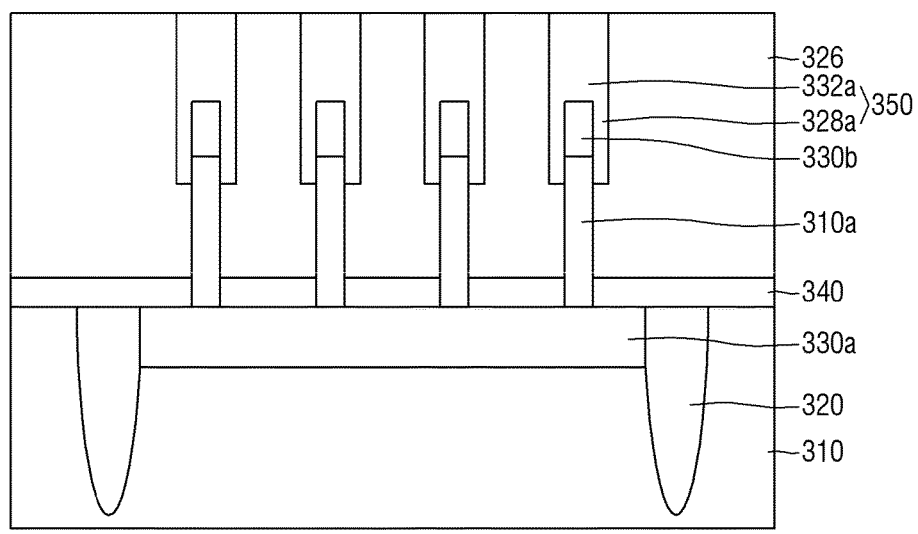

FIGS. 12 and 13 show cross-sectional views relating to operation S220 of FIG. 2B. Referring to FIG. 12, a capping layer 332 may be provided on the resultant structure of FIG. 11. The capping layer 332 connects the spacers 328a to each other. The capping layer 332 is desired to have a high etch selectivity with respect to the first insulation layer 326 and a metal gate, which is to be formed and removed during a metal recess process later. Further, the capping layer 332 is desired to be removed with relative ease while performing an etch process to define contact holes later. For example, the capping layer 332 may be a nitride layer. Referring to FIG. 13, the capping layer 332 may be etched to form a capping pattern 332a in which the capping layer 332 is patterned, such that the spacers 328a and the capping pattern 332a form an intermediate cap structure 350 having a reverse-U shape and covering the source/drain structure 330b. The capping pattern 332a on the source/drain structure 330b connects the spacers 328a to each other. The capping pattern 332a on a top surface of the source/drain region 330b may have a thickness sufficient to leave a desirable thickness after withstanding the metal recess process. For example, in a case that a width of a pillar portion of the intermediate cap structure 350 is about 6 nm and a thickness of a roof portion of the intermediate cap structure 350 may be about 20 nm (e.g., equal to or three times thicker than the width of the pillar portion).

Figure 14:
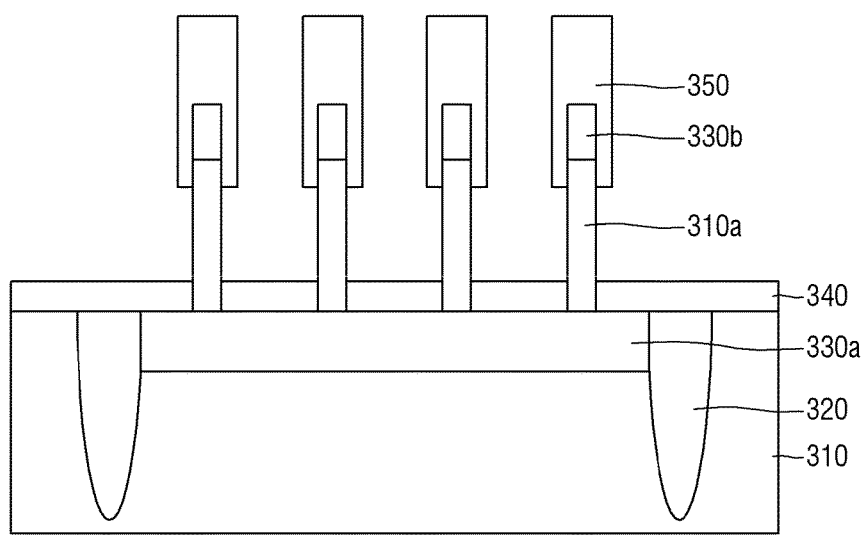

FIG. 14 shows a cross-sectional view after performing operation S222 of FIG. 2B. Referring to FIG. 14, the first insulation layer 326 may be removed. The separation pattern 340 provided in FIG. 3 may function as an etch stop layer later while removing the first insulation layer 326. Due to the presence of the separation pattern 340, shrinkage of the fin structure 310a due to an attack to the substrate 310 and/or a lower portion of the fin structure during the removal process of the first insulation layer 326 may be mitigated or prevented.

Figure 15:
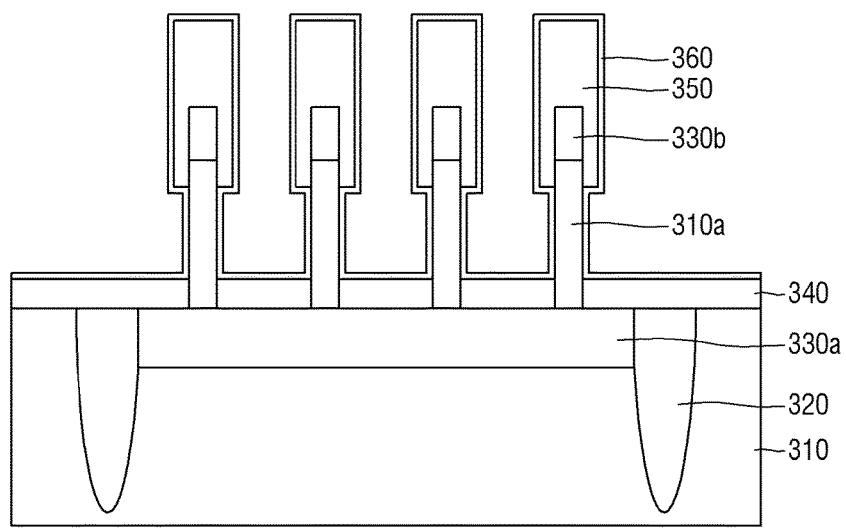

FIG. 15 shows a cross-sectional view after performing operation S224 of FIG. 2B. Referring to FIG. 15, a gate insulation layer 360 may be formed along the separation pattern 340, the fin structure 310a, and the intermediate cap structure 350. The gate insulation layer 360 may include a high-k material. In a case that a width of a pillar portion of the intermediate cap structure 350 is 6 nm, a thickness of the gate insulation layer 360 may be about 1.5 nm. In some example embodiment, a curing process may be performed on the resultant structure before forming the gate insulation layer 360

Figure 16:
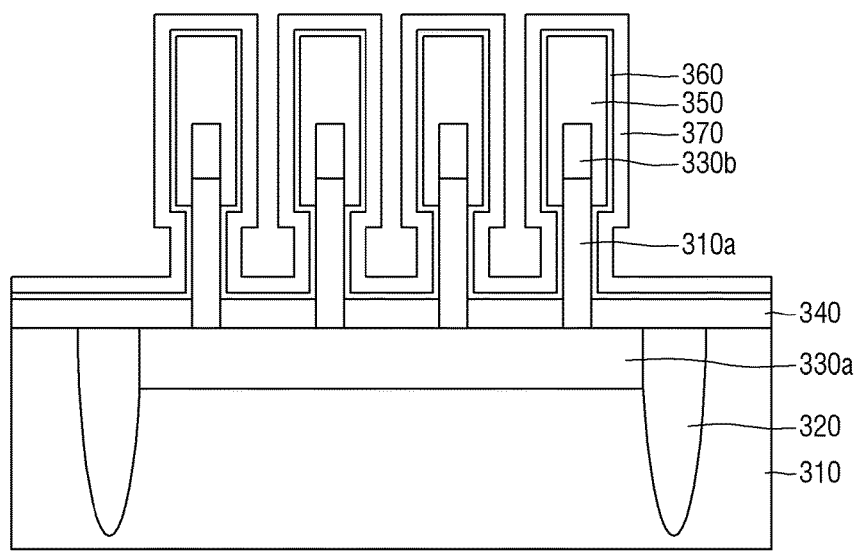

FIG. 16 shows a cross-sectional view after performing operation S226 of FIG. 2B. Referring to FIG. 16, a work function metal layer 370 may be formed on the gate insulation layer 360. In some example embodiments, the work function metal layer 370 may be implemented to have different thicknesses depending on locations by repeatedly performing masking, etching, and depositing processes. The work function metal layer may include TiN.

Figure 17:
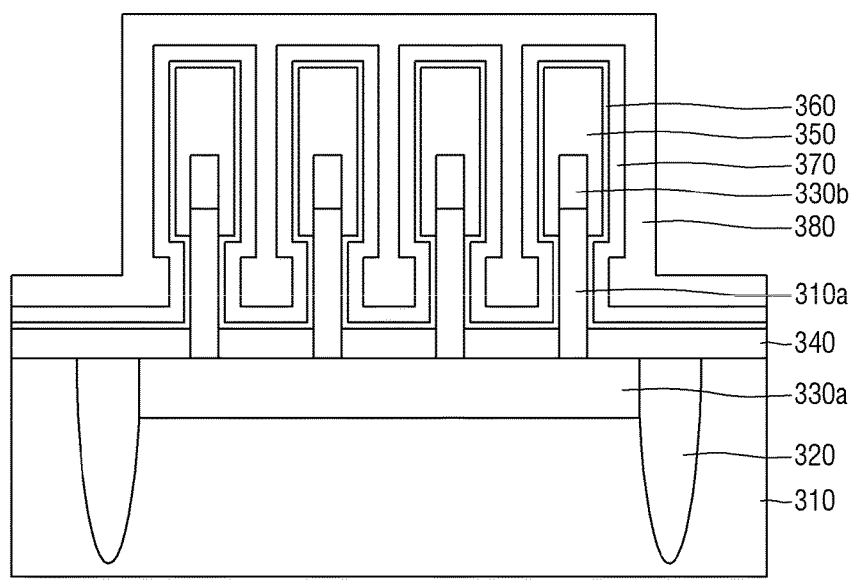

Referring to FIG. 17, a capping metal layer 380 (or alternatively, a buffer metal layer) may be subsequently deposited on the work function metal layer 370 while filling spaces between the plurality of the intermediate cap structures 350. The capping metal layer 380 may include at least one of TiC, TiAlC, or TiAl.

Figure 18:
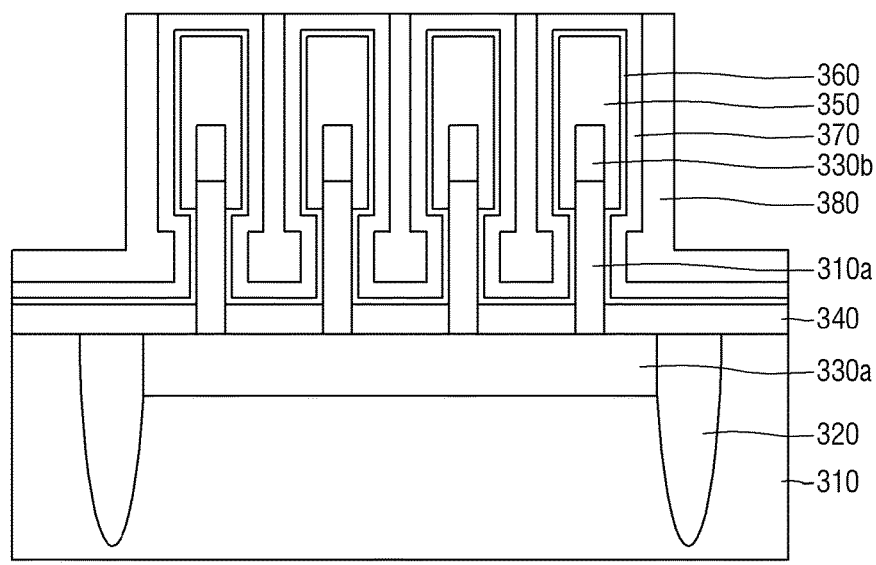
Figure 19:
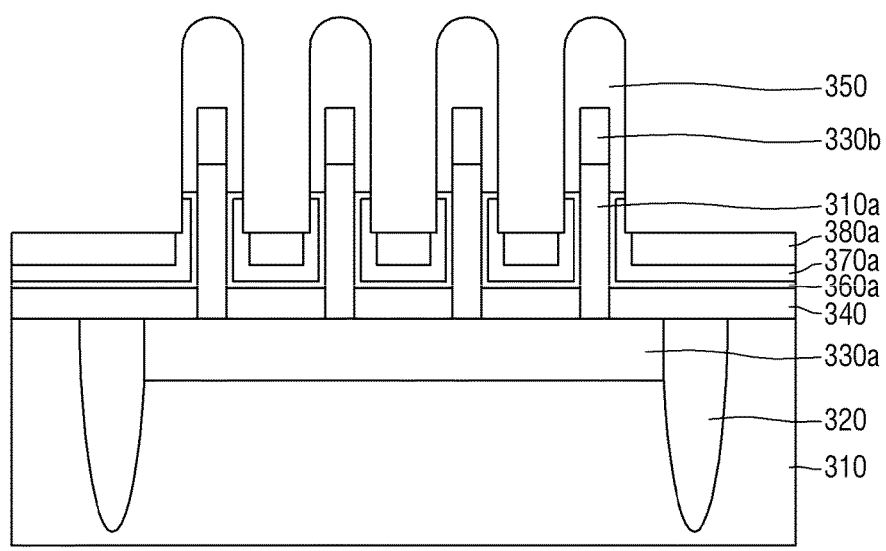

Referring to FIG. 18, the capping metal layer 380 may be planarized using, for example, an etch-back process or a CMP process. Then, as illustrated in FIG. 19, the capping metal layer 380 between the plurality of intermediate cap structure 350 may be recessed to a desired depth, thereby forming a gate insulator 360*a* and a metal gate, which includes a work function metal pattern 370*a* and a capping metal pattern 380*a*. Referring to FIG. 19, a bottom portion of a pillar portion of the intermediate cap structure 350, which extends below a top surface of the intermediate cap structure 350 (e.g., a bottom surface of the epitaxially-grown source/drain structure 330*b*), electrical separates the metal gate from the epitaxially-grown source/drain structure 330*b*. FIG. 19 corresponds to a cross-sectional view after performing operation S228 of FIG. 2B.

Figure 20:
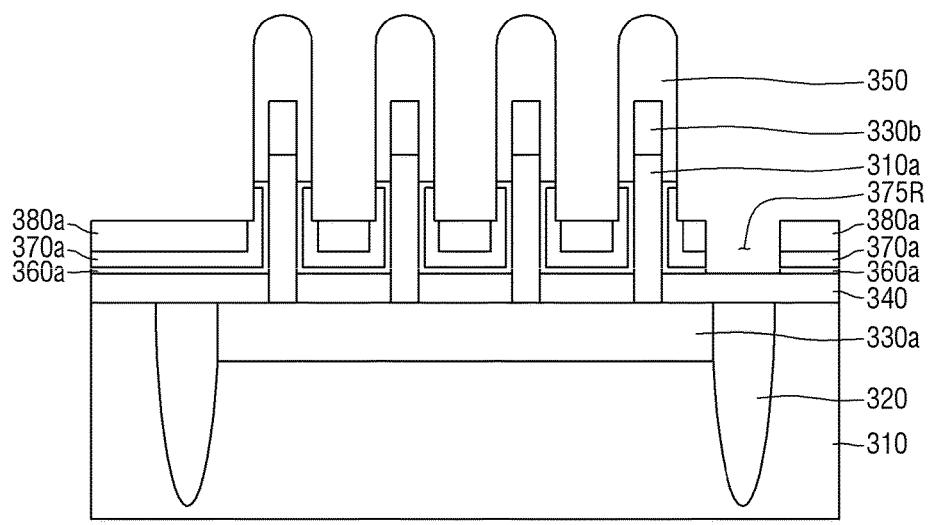

Referring to FIG. 20, a second recess 375R may be formed to recess parts of the work function metal pattern 370*a*, the capping metal pattern 380*a* and the gate insulator 360*a* to cut the metal gate. The second recess 375R, for example, may be overlapped the isolation region 320.

Figure 21:
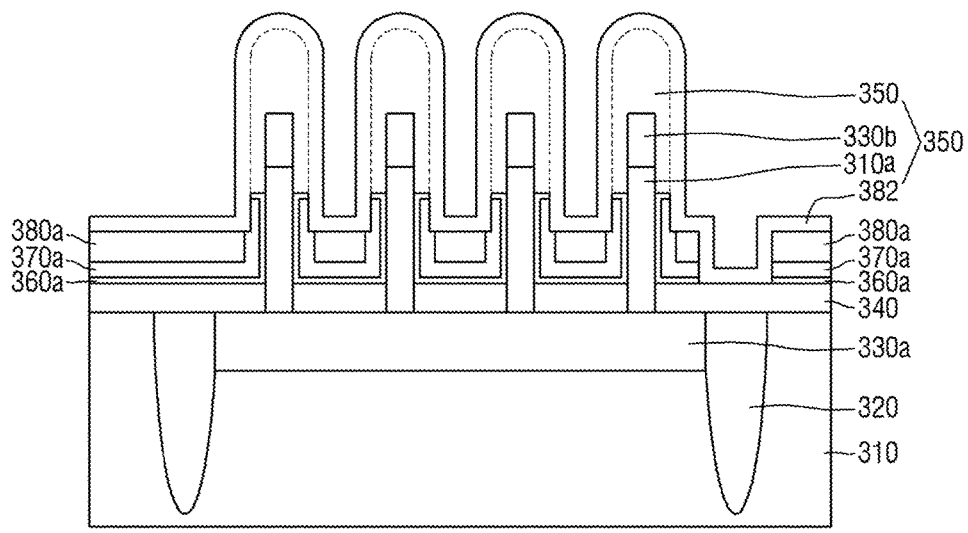

Referring to FIG. 21, a spacer layer 382 may be conformally deposited on the resultant structure of FIG. 20. A cap 350*a* may be formed and the cap 350*a* comprises the intermediate cap structure 350 and the spacer layer 382. The spacer layer 382 may be an oxide layer.

Figure 22:
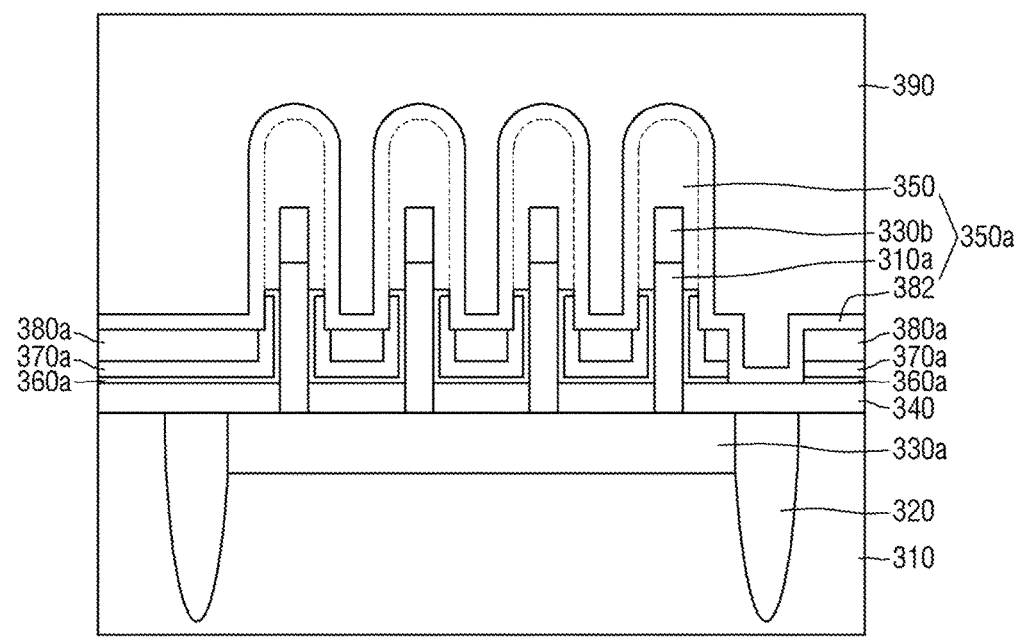
Figure 23:
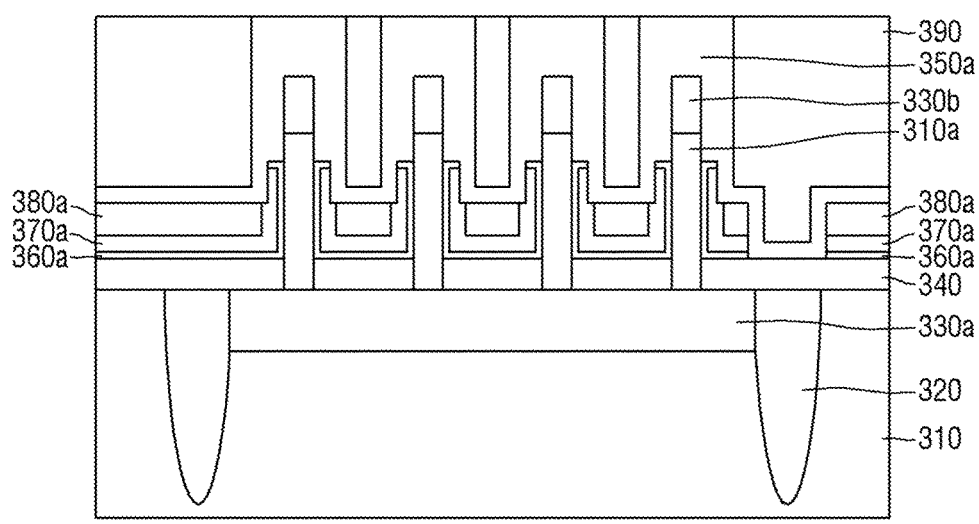

Referring FIG. 22, an inter-layer dielectric (ILD) layer 390 may be deposited on the spacer layer 382 to fill gaps present in the resultant structure of FIG. 21. The ILD layer 390 may be a layer having etching selectivity with respect to the spacer layer 382 and/or the intermediate cap structure 350. For example, in a case that the ILD layer 390 is an oxide layer, and the spacer layer 382 and the intermediate cap structure 350 may be a nitride layer. Thus, the ILD layer 390 may be planarized using the spacer layer 382 and/or the intermediate cap structure 350 as etch stop layers, as illustrated in FIG. 23.

Figure 24:
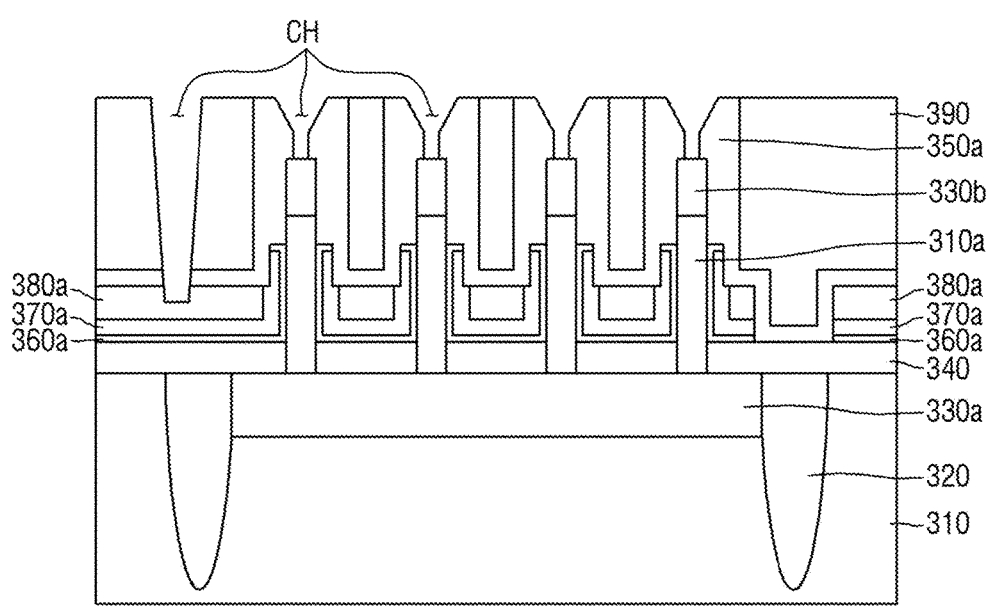

FIG. 24 shows a cross-sectional view after performing operation S230 of FIG. 2B. Referring FIG. 24, contact holes CH (e.g., gate contact holes and source/drain contact holes) may be defined using, for example, a photolithography process (or masking process) and an etching process. Thus, the cap 350*a* in the final VTFET structure may have a reverse-U shape covering top and side surfaces of the source/drain structure 330*b* on a top portion of the fin structure 310*a*. As illustrated, the cap 350*a* may have an opening at a roof portion of the reverse-U shape so that the source/drain region structure 330*b* is electrically connected to a metal interconnection (or a contact plug) to be subsequently formed. In some example embodiments, the photolithography and etching processes can be performed more than once depending on areas at which the respective contact holes CH are formed and/or depending on depth of the respective contact holes CH to be implemented. For example, relatively shallow ones of the contact holes CH may be formed in a first round of photolithography and etching process, and relatively deep ones of the contact holes CH may be formed in a first round of photolithography and etching process.

According to some example embodiments of the present disclosure, a gate length of a VTFET may be defined by a cap having a reverse-U shape. Thus, the gate length of the VTFET can be implemented more precisely, e.g., within a process margin of defining a recess in an insulation layer which surrounds a fin structure serving as a channel of the VTFET.

According to some example embodiments of the present disclosure, a gate length of a VTFET may be defined by a cap including pillar portions, which cover side surfaces of the epitaxially-grown source/drain structure, and partially cover side surfaces of a top portion of a fin structure. Thus, the gate length of the VTFET can be implemented more precisely, e.g., within a process margin of defining a recess (into which the pillar portions of the cap are to be accommodated) in an insulation layer which surrounds the fin structure serving as a channel of the VTFET.

According to some example embodiments of the present disclosure, a gate layer (e.g., a work function metal gate layer) of a vertical tunnel field effect transistor (VTFET) is formed after epitaxially growing a source/drain structure. Thus, electrical characteristics of the gate layer (e.g., a work function metal gate layer) may not be affected by a high temperature accompanying the epitaxial growth process.

According to some example embodiments of the present disclosure, a source/drain structure of a vertical tunnel field effect transistor (VTFET) may be epitaxially grown on a fin structure such that the source/drain structure is laterally confined within spacers, which are provided at both sides of the fin structure and are vertically extending from a position below a top of the fin structure to a position a certain distance above the top of the fin structure, when viewed in a vertical cross section. Thus, a lateral dimension (e.g., width) of the source/drain structure may be defined by the spacers, thereby enabling more precise definition of the source/drain structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims.

What is claimed is:

1. A method of manufacturing a vertical tunnel field effect transistor (VTFET), the method comprising:
providing a fin structure protruding from a substrate and a first insulation layer such that the fin structure is embedded in the first insulation layer and a top surface of the fin structure is exposed by the first insulation layer;
removing the first insulation layer around the fin structure to partially expose side surfaces of the fin structure;
providing spacers on the partially exposed side surfaces of the fin structure;
epitaxially growing a source/drain structure the fin structure and between the spacers;
providing a capping layer to connect the spacers to each other to form an intermediate cap structure having a reverse-U shape, which covers top and side surfaces of the source/drain structure and top portions of the side surfaces of the fin structure;
removing the first insulation layer;

providing a gate insulation layer and a work function metal gate layer along the intermediate cap structure and the fin structure; and partially removing the gate insulation layer and the work function metal gate layer to define a gate insulator and a metal gate under the intermediate cap structure.

2. The method of claim 1, further comprising:
providing a separation pattern to surround bottom portions of the side surfaces of the fin structure, the separation pattern providing electrical isolation between the metal gate and a source/drain region formed in the substrate.

3. The method of claim 1, wherein the providing the fin structure includes:
providing a sacrificial layer on the substrate;
patterning the sacrificial layer and the substrate to form a preliminary fin structure;
providing the first insulation layer to expose a top surface of the preliminary fin structure; and
removing the sacrificial layer to form the fin structure.

4. The method of claim 3, wherein the providing the first insulation layer to expose the top surface of the preliminary fin structure includes,
forming the first insulation layer after the patterning the sacrificial layer and the substrate to form the preliminary fin structure, and
planarizing the first insulation layer until the top surface of the preliminary fin structure is exposed.

5. The method of claim 3, further comprising:
providing an oxide hard mask layer on the sacrificial layer after providing the sacrificial layer on the substrate and before the patterning the sacrificial layer and the substrate to form the preliminary fin structure, and
wherein the patterning the sacrificial layer and the substrate to form the preliminary fin structure includes patterning the oxide hard mask layer together with the sacrificial layer and the substrate.

6. The method of claim 3, wherein the sacrificial layer includes a material having an etch electivity to a material included in the first insulation layer.

7. The method of claim 1, further comprising:
forming a contact hole through the intermediate cap structure to provide a final cap structure such that the final cap structure includes pillar portions which cover the side surfaces of the source/drain structure and cover the top portions of the side surfaces of the fin structure.

8. The method of claim 1, wherein the epitaxially growing the source/drain structure includes:
epitaxially growing the source/drain structure beyond a top surface of the first insulation layer; and
removing the source/drain structure to a thickness such that a top surface of the source/drain structure is lower than the top surfaces of the spacers.

9. The method of claim 1, wherein the providing the capping layer includes:
forming the capping layer on the first insulation layer, the spacers, and the fin structure; and
partially removing the capping layer to form the intermediate cap structure having the reverse-U shape.

10. The method of claim 1, wherein the providing the spacers includes:
providing a second insulation layer on the first insulation layer and the fin structure, the second insulation layer having an etch selectivity with respect to the first insulation layer; and
etching the second insulation layer to form the spacers on the side surfaces of the fin structure that have been exposed by the partially removing the first insulation layer.

11. The method of claim 10, wherein the first insulation layer includes an oxide material and the second insulation layer includes a nitride material.

12. The method of claim 10, wherein the capping layer has an etch selectivity with respect to the second insulation layer and the work function metal gate layer.

13. The method of claim 10, wherein the second insulation layer and the capping layer include a nitride material.

14. The method of claim 1, further comprising:
forming a capping metal layer on the work function metal gate layer before the partially removing the gate insulation layer and the work function metal gate layer.

15. The method of claim 14, wherein the capping metal layer includes at least one of TiAl, TiC, or TiAlC, and the work function metal gate layer includes TiN.

16. A vertical tunnel field effect transistor (VTFET) comprising:
a fin structure protruding from a substrate, the fin structure acting as a channel of the VTFET, the substrate including a source/drain region;
an epitaxially-grown source/drain structure on a surface of the fin structure;
a cap including pillar portions, the pillar portions covering side surfaces of the epitaxially-grown source/drain structure and partially covering side surfaces of a top portion of the fin structure;
a gate insulator covering a remaining portion of the side surfaces of the fin structure under the pillar portions of the cap;
a work function metal gate on the gate insulator; and
a separation pattern surrounding a bottom portion of a fin structure such that the work function metal gate is vertically between the cap and the separation pattern, the separation pattern electrically isolating the work function metal gate from the source/drain region.

17. The VTFET of claim 16, further comprising:
a capping metal gate on the work function metal gate, the capping metal gate extending in a direction parallel to a surface of the substrate.

18. The VTFET of claim 16, wherein the cap includes an insulating material that has an etching selectivity with respect to the work function metal gate.

19. The VTFET of claim 16, wherein the work function metal gate includes a vertical portion on the gate insulator and a horizontal portion on the separation pattern.

20. The VTFET of claim 19, wherein the gate insulator includes a portion between the separation pattern and the horizontal portion of the work function metal gate.

* * * * *

UNITED STATES PATENT AND TRADEMARK OFFICE
CERTIFICATE OF CORRECTION

PATENT NO. : 10,164,057 B1
APPLICATION NO. : 15/878711
DATED : December 25, 2018
INVENTOR(S) : Kyung Yub Jeon et al.

It is certified that error appears in the above-identified patent and that said Letters Patent is hereby corrected as shown below:

On the Title Page

Insert:
--(65) Prior Publication Data
US 2018/0350952 A1    December 6, 2018--

Signed and Sealed this
Second Day of April, 2019

Andrei Iancu
*Director of the United States Patent and Trademark Office*